(12) United States Patent
Smart

(10) Patent No.: US 9,042,434 B2
(45) Date of Patent: May 26, 2015

(54) FILTER

(75) Inventor: Christopher Brian Smart, Royal Wootton Bassett (GB)

(73) Assignee: Intel Corporation, Santa Clara, CA (US)

( * ) Notice: Subject to any disclaimer, the term of this patent is extended or adjusted under 35 U.S.C. 154(b) by 440 days.

(21) Appl. No.: 13/439,679

(22) Filed: Apr. 4, 2012

(65) Prior Publication Data

US 2012/0258676 A1    Oct. 11, 2012

(30) Foreign Application Priority Data

Apr. 5, 2011  (GB) .................................. 1105768.4

(51) Int. Cl.
*H03H 17/02*  (2006.01)
*H04L 27/26*  (2006.01)

(52) U.S. Cl.
CPC ........ *H03H 17/0263* (2013.01); *H04L 27/2624* (2013.01)

(58) Field of Classification Search
CPC ................................................ H03H 17/0263
USPC ........................................................ 375/232
See application file for complete search history.

(56) References Cited

U.S. PATENT DOCUMENTS

| | | | |
|---|---|---|---|
| 4,380,046 A | 4/1983 | Frosch et al. | |
| 4,574,345 A | 3/1986 | Konesky | |
| 4,589,066 A | 5/1986 | Lam et al. | |
| 4,601,031 A | 7/1986 | Walker et al. | |
| 4,603,404 A | 7/1986 | Yamauchi et al. | |
| 4,622,632 A | 11/1986 | Tanimoto et al. | |
| 4,698,746 A | 10/1987 | Goldstein | |
| 4,720,780 A | 1/1988 | Dolecek | |
| 4,736,291 A | 4/1988 | Jennings et al. | |
| 4,814,970 A | 3/1989 | Barbagelata et al. | |
| 4,825,359 A | 4/1989 | Ohkami et al. | |
| 4,858,233 A | 8/1989 | Dyson et al. | |
| 4,890,279 A | 12/1989 | Lubarsky | |
| 4,914,653 A | 4/1990 | Bishop et al. | |
| 4,937,741 A | 6/1990 | Harper et al. | |
| 4,943,912 A | 7/1990 | Aoyama et al. | |
| 4,967,326 A | 10/1990 | May | |
| 4,974,146 A | 11/1990 | Works et al. | |
| 4,974,190 A | 11/1990 | Curtis | |
| 4,992,933 A | 2/1991 | Taylor | |

(Continued)

FOREIGN PATENT DOCUMENTS

| | | |
|---|---|---|
| CN | 101754351 | 6/2010 |
| CN | 101873688 | 10/2010 |

(Continued)

OTHER PUBLICATIONS

Panesar, G. et al., "Deterministic Parallel Processing", Proceedings of the 1st Microgrid Workshop, Jul. 2005.

(Continued)

*Primary Examiner* — Michael Neff
(74) *Attorney, Agent, or Firm* — Schiff Hardin LLP

(57) ABSTRACT

Method and filter for filtering a signal, in which the signal is applied to a delay line having a plurality of taps. Respective weighting coefficients of a windowing function are applied to outputs from the plurality of taps to thereby generate a plurality of weighted outputs. The method comprises repeatedly selecting, for output, whichever of the weighted outputs has the highest value.

12 Claims, 10 Drawing Sheets

(56) References Cited

U.S. PATENT DOCUMENTS

| | | | |
|---|---|---|---|
| 5,036,453 A | 7/1991 | Renner et al. | |
| 5,038,386 A | 8/1991 | Li | |
| 5,065,308 A | 11/1991 | Evans | |
| 5,109,329 A | 4/1992 | Strelioff | |
| 5,152,000 A | 9/1992 | Hillis | |
| 5,193,175 A | 3/1993 | Cutts et al. | |
| 5,233,615 A | 8/1993 | Goetz | |
| 5,239,641 A | 8/1993 | Horst | |
| 5,241,491 A | 8/1993 | Carlstedt | |
| 5,247,694 A | 9/1993 | Dahl | |
| 5,253,308 A | 10/1993 | Johnson | |
| 5,265,207 A | 11/1993 | Zak et al. | |
| 5,280,584 A | 1/1994 | Caesar et al. | |
| 5,353,306 A * | 10/1994 | Yamamoto | 375/233 |
| 5,384,697 A | 1/1995 | Pascucci | |
| 5,386,495 A | 1/1995 | Wong et al. | |
| 5,408,676 A | 4/1995 | Mori | |
| 5,410,723 A | 4/1995 | Schmidt et al. | |
| 5,410,727 A | 4/1995 | Jaffe et al. | |
| 5,473,731 A | 12/1995 | Seligson | |
| 5,488,374 A * | 1/1996 | Frankot et al. | 342/25 C |
| 5,555,548 A | 9/1996 | Iwai et al. | |
| 5,557,751 A | 9/1996 | Banman et al. | |
| 5,570,045 A | 10/1996 | Erdal et al. | |
| 5,600,784 A | 2/1997 | Bissett et al. | |
| 5,692,139 A | 11/1997 | Slavenburg et al. | |
| 5,719,445 A | 2/1998 | McClure | |
| 5,734,921 A | 3/1998 | Dapp et al. | |
| 5,752,067 A | 5/1998 | Wilkinson et al. | |
| 5,761,514 A | 6/1998 | Aizikowitz et al. | |
| 5,790,879 A | 8/1998 | Wu | |
| 5,795,797 A | 8/1998 | Chester et al. | |
| 5,796,937 A | 8/1998 | Kizuka | |
| 5,802,561 A | 9/1998 | Fava et al. | |
| 5,805,839 A | 9/1998 | Singhal | |
| 5,826,033 A | 10/1998 | Hayashi et al. | |
| 5,826,049 A | 10/1998 | Ogata et al. | |
| 5,826,054 A | 10/1998 | Jacobs et al. | |
| 5,845,060 A | 12/1998 | Vrba et al. | |
| 5,860,008 A | 1/1999 | Bradley | |
| 5,861,761 A | 1/1999 | Kean | |
| 5,864,706 A | 1/1999 | Kurokawa et al. | |
| 5,923,615 A | 7/1999 | Leach et al. | |
| 5,926,640 A | 7/1999 | Mason et al. | |
| 5,946,484 A | 8/1999 | Brandes | |
| 5,951,664 A | 9/1999 | Lambrecht et al. | |
| 5,959,995 A | 9/1999 | Wicki et al. | |
| 5,963,609 A | 10/1999 | Huang | |
| 6,023,757 A | 2/2000 | Nishimoto et al. | |
| 6,044,451 A | 3/2000 | Slavenburg | |
| 6,052,752 A | 4/2000 | Kwon | |
| 6,055,285 A | 4/2000 | Alston | |
| 6,069,490 A | 5/2000 | Ochotta et al. | |
| 6,101,599 A | 8/2000 | Wright et al. | |
| 6,122,677 A | 9/2000 | Porterfield | |
| 6,167,502 A | 12/2000 | Pechanek et al. | |
| 6,173,386 B1 | 1/2001 | Key et al. | |
| 6,175,665 B1 | 1/2001 | Sawada | |
| 6,199,093 B1 | 3/2001 | Yokoya | |
| 6,317,820 B1 | 11/2001 | Shiell et al. | |
| 6,345,046 B1 | 2/2002 | Tanaka | |
| 6,360,259 B1 | 3/2002 | Bradley | |
| 6,381,293 B1 | 4/2002 | Lee et al. | |
| 6,381,461 B1 | 4/2002 | Besson et al. | |
| 6,393,026 B1 | 5/2002 | Irwin | |
| 6,408,402 B1 | 6/2002 | Norman | |
| 6,424,870 B1 | 7/2002 | Maeda et al. | |
| 6,448,910 B1 | 9/2002 | Lu | |
| 6,499,096 B1 | 12/2002 | Suzuki | |
| 6,499,097 B2 | 12/2002 | Tremblay et al. | |
| 6,567,417 B2 | 5/2003 | Kalkunte et al. | |
| 6,574,311 B1 * | 6/2003 | Ross et al. | 379/27.08 |
| 6,615,339 B1 | 9/2003 | Ito et al. | |
| 6,631,439 B2 | 10/2003 | Saulsbury et al. | |
| 6,681,341 B1 | 1/2004 | Fredenburg et al. | |
| 6,775,766 B2 | 8/2004 | Revilla et al. | |
| 6,795,422 B2 | 9/2004 | Ohsuge | |
| 6,829,296 B1 | 12/2004 | Troulis et al. | |
| 6,892,293 B2 | 5/2005 | Sachs et al. | |
| 6,928,500 B1 | 8/2005 | Ramanujan et al. | |
| 6,952,181 B2 | 10/2005 | Karr et al. | |
| 6,961,782 B1 | 11/2005 | Denneau et al. | |
| 6,996,157 B2 | 2/2006 | Ohsuge | |
| 7,103,008 B2 | 9/2006 | Greenblat et al. | |
| 7,161,978 B2 | 1/2007 | Lu et al. | |
| 7,237,055 B1 | 6/2007 | Rupp | |
| 7,302,552 B2 | 11/2007 | Guffens et al. | |
| 7,340,017 B1 | 3/2008 | Banerjee | |
| 7,342,414 B2 | 3/2008 | DeHon | |
| 7,383,422 B2 | 6/2008 | Kageyama et al. | |
| 7,428,721 B2 | 9/2008 | Rohe et al. | |
| 7,549,081 B2 | 6/2009 | Robbins et al. | |
| 7,672,836 B2 | 3/2010 | Lee et al. | |
| 7,712,067 B1 | 5/2010 | Fung et al. | |
| 7,801,029 B2 | 9/2010 | Wrenn et al. | |
| 7,804,719 B1 | 9/2010 | Chirania et al. | |
| 8,032,142 B2 | 10/2011 | Carter et al. | |
| 2002/0045433 A1 | 4/2002 | Vihriala | |
| 2002/0069345 A1 | 6/2002 | Mohamed et al. | |
| 2002/0090924 A1 * | 7/2002 | Suominen | 455/302 |
| 2002/0174318 A1 | 11/2002 | Stuttard et al. | |
| 2002/0198606 A1 | 12/2002 | Satou | |
| 2003/0063664 A1 * | 4/2003 | Bodenschatz | 375/232 |
| 2003/0154358 A1 | 8/2003 | Seong | |
| 2003/0235241 A1 | 12/2003 | Tamura | |
| 2004/0078548 A1 | 4/2004 | Claydon et al. | |
| 2004/0083409 A1 | 4/2004 | Rozenblit et al. | |
| 2004/0139466 A1 | 7/2004 | Sharma et al. | |
| 2004/0150422 A1 | 8/2004 | Wong et al. | |
| 2004/0198386 A1 | 10/2004 | Dupray | |
| 2005/0083840 A1 | 4/2005 | Wilson | |
| 2005/0114565 A1 | 5/2005 | Gonzalez et al. | |
| 2005/0124344 A1 | 6/2005 | Laroia et al. | |
| 2005/0163248 A1 | 7/2005 | Berangi et al. | |
| 2005/0250502 A1 | 11/2005 | Laroia et al. | |
| 2005/0282500 A1 | 12/2005 | Wang et al. | |
| 2006/0087323 A1 | 4/2006 | Furse et al. | |
| 2006/0089154 A1 | 4/2006 | Laroia et al. | |
| 2006/0251046 A1 | 11/2006 | Fujiwara | |
| 2006/0268962 A1 | 11/2006 | Cairns et al. | |
| 2007/0036251 A1 | 2/2007 | Jelonnek et al. | |
| 2007/0127556 A1 | 6/2007 | Sato | |
| 2007/0173255 A1 | 7/2007 | Tebbit et al. | |
| 2007/0183427 A1 | 8/2007 | Nylander et al. | |
| 2007/0220522 A1 | 9/2007 | Coene et al. | |
| 2007/0220586 A1 | 9/2007 | Salazar | |
| 2007/0248191 A1 | 10/2007 | Pettersson | |
| 2007/0254620 A1 | 11/2007 | Lindqvist et al. | |
| 2007/0263544 A1 | 11/2007 | Yamanaka et al. | |
| 2007/0270151 A1 | 11/2007 | Claussen et al. | |
| 2008/0146154 A1 | 6/2008 | Claussen et al. | |
| 2008/0151832 A1 | 6/2008 | Iwasaki | |
| 2009/0003263 A1 | 1/2009 | Foster et al. | |
| 2009/0042593 A1 | 2/2009 | Yavuz et al. | |
| 2009/0046665 A1 | 2/2009 | Robson et al. | |
| 2009/0080550 A1 | 3/2009 | Kushioka | |
| 2009/0092122 A1 | 4/2009 | Czaja et al. | |
| 2009/0097452 A1 | 4/2009 | Gogic | |
| 2009/0098871 A1 | 4/2009 | Gogic | |
| 2009/0111503 A1 | 4/2009 | Pedersen et al. | |
| 2009/0150420 A1 | 6/2009 | Towner | |
| 2009/0163216 A1 | 6/2009 | Hoang et al. | |
| 2009/0168907 A1 | 7/2009 | Mohanty et al. | |
| 2009/0196253 A1 | 8/2009 | Semper | |
| 2009/0215390 A1 | 8/2009 | Ku et al. | |
| 2009/0252200 A1 | 10/2009 | Dohler et al. | |
| 2009/0264077 A1 | 10/2009 | Damnjanovic | |
| 2009/0296635 A1 | 12/2009 | Hui et al. | |
| 2010/0035556 A1 | 2/2010 | Cai et al. | |
| 2010/0046455 A1 | 2/2010 | Wentink et al. | |
| 2010/0054237 A1 | 3/2010 | Han et al. | |
| 2010/0087148 A1 | 4/2010 | Srinivasan et al. | |
| 2010/0105345 A1 | 4/2010 | Thampi et al. | |
| 2010/0111070 A1 | 5/2010 | Hsu | |

(56) References Cited

U.S. PATENT DOCUMENTS

| | | |
|---|---|---|
| 2010/0157906 A1 | 6/2010 | Yang et al. |
| 2010/0195525 A1 | 8/2010 | Eerolainen |
| 2010/0215032 A1 | 8/2010 | Jalloul et al. |
| 2010/0216403 A1 | 8/2010 | Harrang |
| 2010/0216485 A1 | 8/2010 | Hoole |
| 2010/0222068 A1 | 9/2010 | Gaal et al. |
| 2010/0234061 A1 | 9/2010 | Khandekar et al. |
| 2010/0248646 A1 | 9/2010 | Yamazaki et al. |
| 2010/0273481 A1 | 10/2010 | Meshkati et al. |
| 2010/0279689 A1 | 11/2010 | Tinnakornsrisuphap et al. |
| 2011/0002426 A1 | 1/2011 | Muirhead |
| 2011/0122834 A1 | 5/2011 | Walker et al. |
| 2011/0130143 A1 | 6/2011 | Mori et al. |
| 2011/0170494 A1 | 7/2011 | Kim et al. |

FOREIGN PATENT DOCUMENTS

| | | | |
|---|---|---|---|
| EP | 0 180 212 | A3 | 5/1986 |
| EP | 492174 | A3 | 7/1992 |
| EP | 0 877 533 | A3 | 11/1998 |
| EP | 0 973 099 | | 1/2000 |
| EP | 0 977 355 | | 2/2000 |
| EP | 1054523 | | 11/2000 |
| EP | 1 134 908 | | 9/2001 |
| EP | 1418776 | | 5/2004 |
| EP | 1 946 506 | | 7/2008 |
| EP | 1876854 | | 9/2008 |
| EP | 2 071 738 | | 6/2009 |
| EP | 2 326 118 | | 5/2011 |
| GB | 2 304 495 | | 3/1997 |
| GB | 2 370 380 | | 6/2002 |
| GB | 2398651 | | 8/2004 |
| GB | 2 414 896 | | 12/2005 |
| GB | 2391083 | | 3/2006 |
| GB | 2 447 439 | | 9/2008 |
| GB | 2463074 | | 3/2010 |
| JP | 61123968 | | 6/1986 |
| JP | A-8-297652 | | 11/1996 |
| JP | 11272645 | | 10/1999 |
| JP | 2001-034471 | | 2/2001 |
| JP | 2004-525439 | | 8/2004 |
| JP | 2006-500673 | | 1/2006 |
| WO | 90/04235 | | 4/1990 |
| WO | 91/11770 | | 8/1991 |
| WO | 97/26593 | | 7/1997 |
| WO | 98/50854 | | 11/1998 |
| WO | 01/02960 | | 1/2001 |
| WO | 02/50624 | | 6/2002 |
| WO | 03/001697 | | 1/2003 |
| WO | 2004/029796 | A3 | 4/2004 |
| WO | 2004/034251 | | 4/2004 |
| WO | 2004/102989 | | 11/2004 |
| WO | 2005/048491 | | 5/2005 |
| WO | 2006/059172 | | 6/2006 |
| WO | 2007/021139 | | 2/2007 |
| WO | 2007/054127 | | 5/2007 |
| WO | 2007/056733 | | 5/2007 |
| WO | 2007/126351 | | 11/2007 |
| WO | 2008/030934 | | 3/2008 |
| WO | 2008/090154 | | 7/2008 |
| WO | 2008/099340 | | 8/2008 |
| WO | 2008/155732 | | 12/2008 |
| WO | 2009/054205 | | 4/2009 |
| WO | 2010/072127 | | 1/2010 |
| WO | 2010/126155 | | 11/2010 |

OTHER PUBLICATIONS

Towner, D. et al., "Debugging and Verification of Parallel Systems—the picoChip way", 2004.

picoChip, "PC7203 Development Platform Preliminary Product Brief", Jul. 2007.

Ennals, R. et al., "Task Partitioning for Multi-core Network Processors", 2005.

Rabideau, Daniel J., et al., "Simulated Annealing for Mapping DSP Algorithms on to Multiprocessors," Signals, Systems and Computers, 1993 Conference Record of the Twenty-Seventh Asilomar Conference, Nov. 1-3, 1993, IEEE, pp. 668-672.

Nanda, Ashwini K., et al., "Mapping Applications onto a Cache Coherent Multiprocessor, " Conference on High Performance Networking and Computing, Proceedings of the 1992 ACM/IEEE Conference on Supercomputing, 1992, IEEE, pp. 368-377.

Lin, Lian-Yu, et al., Communication-driven Task Binding for Multiprocessor with Latency Insensitive Network-on-Chip, Design Automation Conference, 2005 Proceedings of th ASP-DAC, Jan. 18-21, 2005, IEEE, pp. 39-44.

Holger Claussen, Bell Laboratories, Alcatel-Lucent; "Performance of Macro and Co-Channel Femtocells in a Hierarchical Cell Structure"; The 18th Annual IEEE Internation Symposium on Personal, Indoor and Mobile Radio Communications (PIMRC'07); Sep. 1, 2007; pp. 1-5, XP031168593, ISBN: 978-1-4244-1143-6; Swindon, United Kingdom.

Shiroshita, T., et al.: "Reliable data distribution middleware for large-scale massive data replication" Parallel and Distributed Information Systems, 1993, Fourth International Conference on Miami Beach, FL, USA Dec. 18-20, 1996, Los Alamitos, CA, USA IEEE Comput. Soc, US, Dec. 18, 1996, pp. 196-205m XP010213188 ISBN: 0-8186-7475-X.

Levine B. N. et al.: "A comparison of known classes of reliable multicast protocols" Netowrk Protocols, 1996 International Conference on Columbus, OH, USA Oct. 29-Nov. 1, 1996, Los Alamitos, CA, USA IEEE Comput. Soc. US Oct. 29, 1996, pp. 112-121, XP010204425 ISBN: 0-8186-7453-9.

Ishijima, et al., A Semi-Synchronous Circuit Design Method by Clock Tree Modification IEEE Trans. Fundamentals, vol. E85-A, No. 12 Dec. 2002.

Greenstreet, et al., Implementing a STARI Chip, IEEE 1995.

Hierarchical multiprocessor organizations; J. Archer Harris; David R. Smith; International Symposium on computer Architecture; Proceedings of the 4th annual symposium on Computer architecture pp. 41-48 Year of Publication 1977.

"Hierarchical Interconnection Networks for Multicomputer systems" Sivarama P. Dandamudi, et al. IEEE Transactions on Computers archive vol. 39, Issue 6 (Jun. 1990 ) pp. 786-797 Year of Publication: 1990.

A Cluster Structure as an Interconnection Network for Large Multimicrocomputer Systems Wu, S.B. Liu, M.T. This paper appears in: Transactions on Computers Publication Date: Apr. 1981 vol. C-30, Issue: 4 on pp. 254-264.

Performance Analysis of Multilevel Bus Networks for Hierarchichal Multiprocessors S.M. Mahmud IEEE Transactions on Computers archive vol. 43, Issue 7 (Jul. 1994) pp. 789-805 Year of Publication: 1994.

Performance Analysis of a Generalized Class of M-Level Hierarchical Multiprocessor Systems I.O. Mahgoub A.K. Elmagarmid Mar. 1992 (vol. 3, No. 2) pp. 129-138.

Kober, Rudolf, "The Multiprocessor System SMS 201—Combining 128 Microprocessors to a Powerful Computer," Sep. 1977, Compcon '77, pp. 225-230.

Knight, Thomas and Wu, Henry, "A Method for Skew-free Distribution of Digital Signals using Matched Variable Delay Lines," VLSI Circuits, 1993. Digest of Technical Papers. 1993 Symposium on, May 1993, pp. 19-21.

Popli, S.P., et al., "A Reconfigurable VLSI Array for Reliability and Yield Enhancement," Proceedings of the International Conference on Systolic Arrays, 1988, pp. 631-642.

John, L.K., et al., "A Dynamically Reconfigurable Interconnect for Array Processors," IEE Transactions on Very Large Scale Integration (lvsi) Systems, vol. 6, No. 1, Mar. 1998, pp. 150-157.

Schmidt, U., et al., "Datawave: A Single-Chip Multiprocessor for Video Applications," IEEE Micro, vol. 11, No. 3, Jun. 1991, pp. 22-25, 88-94.

Chean, M., et al., "A Taxonomy of Reconfiguration Techniques for Fault-Tolerant Processor Arrays," Computer, IEEE Computer Society, vol. 23, No. 1, Jan. 1990, pp. 55-69.

(56) References Cited

OTHER PUBLICATIONS

Kamiura, N., et al., "A Repairable and Diagnosable Cellular Array on Multiple-Valued Logic," Proceedings of the 23rd International Symposium on Multiple-Valued Logic, 1993, pp. 92-97.
LaForge, 1., "Externally Fault Tolerant Arrays," Proceedings: International Conference on Wafer Scale Integration, 1989, pp. 365-378.
Reiner Hartenstein, et al., On Reconfigurable Co-Processing Units, Proceedings of Reconfigurable Architectures Workshop (RAW98), Mar. 30, 1998.
Schmidt, U., et al., "Data-Driven Array Processor for Video Signal Processing", IEEE—1990 (USA).
Muhammad Ali Mazidi, "The 80×86 IBM PC and Compatible Computers", 2003, Prentice Hall, 4th edition, pp. 513-515.
Shigei, N., et al., "On Efficient Spare Arrangements and an Algorithm with Relocating Spares for Reconfiguring Processor Arrays," IEICE Transactions on Fundamentals of Electronics, communications and Computer Sciences, vol. E80-A, No. 6, Jun. 1997, pp. 988-995.
"Interference Management in Femto Cell Deployment", Mingxi Fan, Mehmet Yavuz, Sanjiv Nanda, Yeliz Tokgoz, Farhad Meshkati, Raul Dangui, Qualcomm Incorporated, Qualcomm 3GPP2 Femto Workshop, Boston, MA, Oct. 15, 2007.
3GPP TS 36.331 v9.2.0 3rd Generation Partnership Project: Technical Specification Group Radio Access Network; Evolved Universal Terrestrial Radio Acces (E-UTRA); Radio Resource Control (RRC) Protocol specification (Release 9) Mar. 2010, pp. 1-248.
Alcatel-Lucent, et al., "Congested H(e)NB Hybrid Access Mode cell", 2009, 3GPP Draft; R3-091053-Congested H(e)NB, $31^{rd}$ Generation Partnership Project (3GPP), Apr. 29, 2009, 4 pages.
Motorola, "Text proposal for TR 36.9xx: Reducing HeNB interference by dynamically changing HeNB access mode", 2009, 3GPP Draft: R4-094688, Apr. 29, 2009, 2 pages.
MIPS, MIPS32 Architecture for Programmers, 2001, MIPS Technologies, vol. 2, pp. 1-253.
Pechanek, et al. ManArray Processor Interconnection Network: An Introduction, Euro-Par'99, LNCS 1685, pp. 761-765, 1999.
Waddington, T., Decompilation of "hello world" on Pentium and SPARC, 4 pages, [retrieved on Aug. 3, 2012]. Retrieved from the Internet:<URL: http://web.archive.org/web/20050311141936/http://boomerang.sourceforge.net/helloworld.html>.
Balakrishnan, et al., CodeSurfer/x86—A Platform for Analyzing x86 Executables, Springer-Verlag Berlin Heidelber, 2005, [retrieved on Dec. 30, 2011], retrieved from the internet:<URL:http://www.springerlink com/content/uneu2a95u9nvb20v/>.
Miecznikowski, J., et al., "Decompiling Java Using Stage Encapsulation", Proceedings of the Eighth Working Conference on Reverse Engineering, Oct. 2-5, 2001.
"Details on specification aspects for UL ICC", 3GPP TSF-RAN WG1 #53, R1-081973, Qualcomm Europe, May 5-9, 2008, 2 pages.

\* cited by examiner ic
FILTER

PRIORITY CLAIM

This application claims priority to and the benefit of Great Britain Application No. 1105768.4 filed on Apr. 5, 2011.

FIELD OF THE INVENTION

The present invention relates to a filter, particularly but not exclusively for use in crest factor reduction.

RELATED ART

When a transmit signal is to be transmitted from a transmitter in a wireless network then the signal is amplified by a power amplifier. If the power of an input signal to the power amplifier is below a maximum power level, then the power amplifier operates in a linear manner where an increase in input power is matched by a proportional increase in the power of the output signal from the power amplifier, (i.e. the power amplifier operates in a linear region). However, if the power of the input signal exceeds the maximum power level, then the power amplifier operates in a nonlinear manner such that an increase in the power of the input signal is not matched by a proportional increase in the power of the output signal. The power of the output signal is less than ideal in the power amplifier's nonlinear operating range resulting in an increased Error Vector Magnitude (EVM). It may therefore be advantageous to operate the power amplifier in the linear region.

Crest factor reduction (CFR) may be performed on a transmit signal prior to power amplification by a power amplifier. CFR reduces the peak to average power ratio (PAPR) of the transmit signal, thereby reducing the likelihood that peaks in the transmit signal will result in the power amplifier operating in a non-linear region. Crest factor reduction reduces the PAPR of the transmit signal by clipping the transmit signal at a maximum level. This clipping can introduce errors and/or distortion into the transmit signal and as such a filter is used to smooth out the clipping of the transmit signal. Filters can spread out variations in a signal over time. This allows filters to be used to remove discontinuities in a signal.

One example of a filter is a Finite Impulse Response (FIR) filter which can be implemented in discrete time intervals and may be described as a weighted sum of delayed inputs. FIG. 1 shows a schematic circuit diagram of an FIR filter 100 which can be implemented to filter an input signal (in) to generate an output signal (out). The FIR filter 100 comprises a delay line which includes N−1 delay elements $102_1$ to $102_{N-1}$. N taps are shown in the delay line wherein the output from each of the delay elements 102 is provided by a respective tap. The output on each of the N taps is applied to a respective weighting element $104_0$ to $104_{N-1}$, wherein the weighting elements 104 apply filter coefficients, $w_0 \ldots w_{N-1}$, (or "tap weights") to the outputs on the taps. The weighted outputs are then summed together, e.g. in a summation block 106 and the output of the summation block 106 provides the filtered output signal (out). The FIR filter 100 may be known as a windowing filter, wherein the coefficients $w_0 \ldots w_{N-1}$ are defined by a windowing function, such as a Hamming window function or a Kaiser window function. Other window functions may be used as would be apparent to one skilled in the art.

The input signal is a sequence of samples (x(n)) which are passed through the delay line of the FIR filter 100 to generate the output signal as a sequence of output samples (y(n)). The output samples are given by the equation:

$$y(n)=\sum_{i=0}^{N-1} w_i x[n-i]. \quad (1)$$

The weighting coefficients ($w_0 \ldots w_{N-1}$) are chosen to apply a particular window function to the input signal in order to filter the input signal.

The effect of filtering an input signal having two pulses is shown in FIG. 2. FIG. 2 shows the input signal having a first pulse $202_1$ and a second pulse $202_2$ at a later point in time. The two pulses have a short duration relative to the time taken for the input signal to pass though of the delay elements 102 of the delay line of the FIR filter 100. Apart from the two pulses in the input signal, the value of the input signal 202 (i.e. the signal strength) shown in FIG. 2 is zero. This is to provide a simple example of how the FIR filter 100 operates. The output signal from the FIR filter 100 is shown by line 204. The output signal has two peaks ($204_1$ and $204_2$) corresponding to the two pulses of the input signal, but the duration of the peaks $204_1$ and $204_2$ is longer than the duration of the pulses of the input signal ($202_1$ and $202_2$) due to the filtering of the FIR filter 100. The timings of the input and output signals in the graph of FIG. 2 have been shifted relative to each other to more clearly represent how the peaks of the output signal (204) relate to the pulses of the input signal (202). However, it should be appreciated that a peak on the output signal (e.g. peak $204_1$) will not begin until the pulse on the input signal (e.g. pulse $202_1$) has been received at the FIR filter 100. Therefore the pulses on the input signal 202 will actually occur before the corresponding peaks on the output signal 204, contrary to what is suggested by the graph shown in FIG. 2. This would be apparent to a person skilled in the art.

It can be appreciated from FIG. 2 that the effect of the filtering performed by the FIR filter 100 is to smooth out sudden variations in the input signal into a smooth windowed output. This is because the output of the FIR filter 100 is based on the value of the input signal over the recent history (i.e. over the amount of time equal to the total time taken for a signal sample to pass through the delay line of the FIR filter 100), rather than being based solely on the instantaneous value of the input signal.

SUMMARY

The inventor has realised that with the FIR filter 100 of the prior art there can be a problem if the input signal has multiple pulses within the duration of the window of the filter 100, or if a single pulse of the input signal lasts for longer than a single sample. For example, this can be a problem for a filter used in crest factor reduction. In these cases the gain of the FIR filter 100 will be greater than unity and so the magnitude of the windowed output will be increased beyond the maximum level of the input signal. This can be appreciated by considering FIG. 2 and equation (1) above. If the pulses $202_1$ and $202_2$ were closer together in time such that the windowed outputs ($204_1$ and $204_2$) of the pulses overlapped with each other then the summation block 106 would add the windowed output peaks together and it is therefore possible for the signal strength of the output signal to extend beyond the maximum signal strength of the input pulses $202_1$ and $202_2$. For some input signals this may not be a problem, but the inventor has realised that for some other input signals it may be problematic for the output signal to have a magnitude which extends beyond the maximum magnitude of the input signal.

One example of a wireless network in which signals may be transmitted is a femtocell which provides network coverage to small areas. Femtocells are small, low-power, indoor cellular base stations designed for residential deployment. They provide better network coverage and capacity than that available in such environments from the overlying macrocellular network. In addition, femtocells use a broadband connection to receive data from and send data back to the operator's network (known as "backhaul"). However, embodiments of the invention may be implemented in any type of wireless network and is not limited to use in a femtocell.

In order to address the above-mentioned problem with the FIR filter 100, a modification to the FIR filter 100 is described herein.

According to a first aspect of the invention there is provided a method of filtering a signal comprising applying the signal to a delay line having a plurality of taps. Applying respective weighting coefficients of a windowing function to outputs from the plurality of taps to thereby generate a plurality of weighted outputs. Then, repeatedly selecting, for output, whichever of weighted outputs has the highest value. The method may also include filtering the selected outputs over time to thereby generate a filtered signal.

According to a second aspect of the invention there is provided a filter for filtering a signal. This filter includes a delay line having a plurality of taps, the delay line being arranged to receive the signal. The filter also includes weighting means for applying respective weighting coefficients of a windowing function to outputs from the plurality of taps to thereby generate a plurality of weighted outputs. Also part of this filter is selecting means for repeatedly selecting, for output, whichever of the weighted outputs has the highest value. The filter may also comprise filtering means for filtering the selected outputs over time to thereby generate a filtered signal.

Advantageously, by filtering a signal using the filter as described above the signal strength of filtered signal will not extend beyond the maximum signal strength of the signal prior to filtering. For some signals, this can be particularly advantageous, for example, when the signal is a scaling factor which has been generated for a transmit signal as described in more detail below.

In preferred embodiments, the step of filtering the selected outputs over time comprises passing the selected outputs to a further delay line having a further plurality of taps and determining an average of outputs from the further plurality of taps, wherein the average of the outputs from the further plurality of taps is used as the filtered signal. In this way, the filtering of the selected outputs over time may smooth out discontinuities in the selected outputs.

The step of selecting whichever of the weighted outputs has the highest value may be repeated for each sample of the input signal.

In some embodiments there is provided a method and processing block for processing a transmit signal for transmission from a transmitter, wherein a scaling factor is generated from the transmit signal using a function which is dependent upon the value of the transmit signal and a threshold value, the threshold value indicating a maximum value to which the transmit signal is to be limited. The scaling factor is filtered using the filter described above, and the filtered scaling factor is applied to the transmit signal such that the transmit signal does not exceed the maximum value indicated by the threshold value. The transmitter may be arranged to transmit the transmit signal in a WCDMA femtocell. Alternatively, the transmitter may be arranged to transmit the transmit signal in other types of cell, such as a WiMAX (Worldwide Interoperability for Microwave Access) cell or a cell using the LTE (Long Term Evolution) standard.

The processing block may be a crest factor reduction (CFR) block which is used to reduce the Peak-to-Average Power Ratio (PAPR) of the transmit signal, e.g. prior to power amplification of the transmit signal in the transmit chain of the transmitter. Implementing crest factor reduction on the transmit signal means that the transmit back-off level of a power amplifier to which the transmit signal is supplied can be reduced, resulting in higher radio frequency (RF) power, without moving into the non-linear region of the power amplifier.

By filtering the scaling factor the effect of clipping across the rise and fall of peaks in the scaling factor can be smoothed, rather than just truncating the magnitude of the transmit signal at its maximum value. This smoothing reduces the spectral re-growth in the transmit signal.

Using the FIR filter 100 of the prior art in the crest factor reduction block can cause excessive clipping of the transmitted signal, leading to an increased Error Vector Magnitude (EVM), and a failure to reduce the magnitude of the largest peaks in the transmit signal to prevent them exceeding the maximum value for the transmit signal. However, using a filter according to the preferred embodiments of the invention in the crest factor reduction block will prevent the gain applied to the scaling factor by the filter from exceeding unity. In turn this will reduce the EVM associated with over-clipping of sustained or multiple peaks in the transmit signal, without introducing significant spectral re-growth.

Also disclosed is a transmitter for transmitting a transmit signal. The transmitter comprising a processing block having generating means for generating a scaling factor from the transmit signal using a function which is dependent upon a value of the transmit signal and a threshold value, the threshold value indicating a maximum value to which the transmit signal is to be limited. Also part of this embodiment is a filter for filtering a scaling factor to thereby generate a filtered scaling factor. Also provided are applying means for applying the filtered scaling factor to the transmit signal such that the transmit signal does not exceed a maximum value indicated by the threshold value, and a power amplifier for performing power amplification on the transmit signal. In one configuration the transmitter is arranged to transmit the transmit signal in a WCDMA femtocell.

BRIEF DESCRIPTION OF THE DRAWINGS

For a better understanding of the present invention and to show how the same may be put into effect, reference will now be made, by way of example, to the following drawings in which.

DETAILED DESCRIPTION OF PREFERRED EMBODIMENTS

Figure 3:
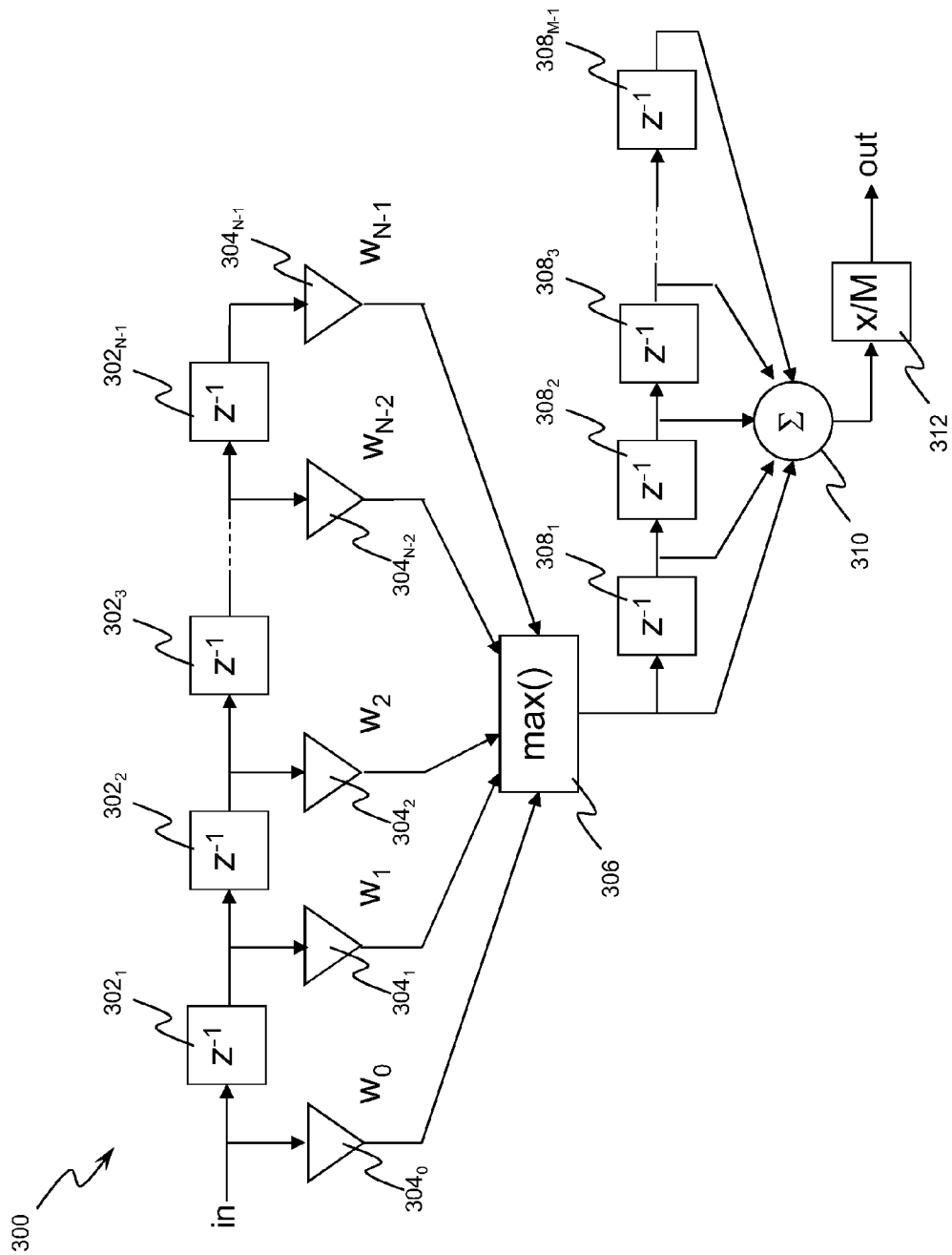
FIG. 3 is a schematic diagram of a filter according to a preferred embodiment.
Figure 4:
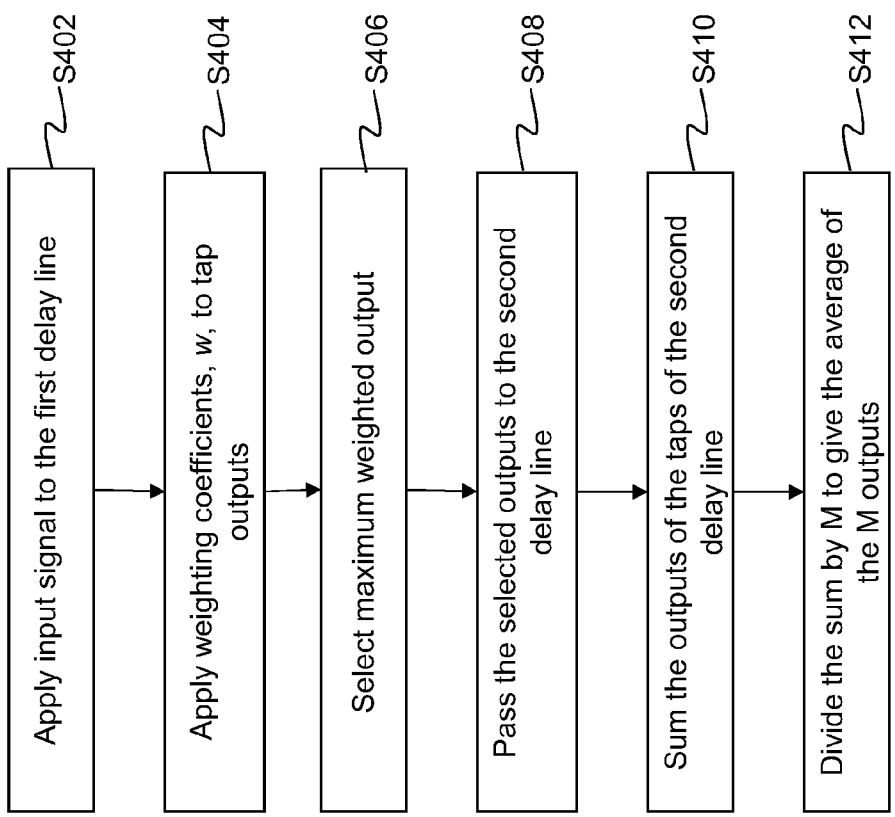
FIG. 4 is a flow chart for a process of filtering a signal using a filter according to a preferred embodiment.

Preferred embodiments of the invention will now be described by way of example only. With reference to FIGS. 3 and 4 there will now be described a filter 300 according to a preferred embodiment. The filter 300 can be implemented to filter an input signal ("in") to generate an output signal ("out"). The filter 300 comprises a first delay line which includes a plurality (N−1) of delay elements $302_1$ to $302_{N-1}$. The filter also comprises a plurality (N) of weighting elements $304_0$ to $304_{N-1}$ and a selection block 306. The filter 300 also comprises a supplementary filter which includes a second delay line having a plurality (M−1) of delay elements $308_1$ to $308_{M-1}$, a summation block 310 and a dividing block 312. A plurality (N) of taps are arranged to provide the output from each of the delay elements 302 in the first delay line to a respective one of the weighting elements 304. The outputs of each of the weighting elements 304 are coupled to the selection block 306. An output of the selection block 306 is coupled to an input of the second delay line. A plurality (M) of taps are arranged to provide the output from each of the delay elements 308 in the second delay line to the summation block 310. An output of the summation block 310 is coupled to an input of the dividing block 312. An output of the dividing block 312 is coupled to an output line of the filter 300 to provide the output signal ("out") from the filter 300.

In operation, in step S402 an input signal ("in") is applied to the first delay line. In this way the input signal is supplied to the first delay element $302_1$ of the first delay line and to the first weighting element $304_0$. Over time, the input signal is passed along the first delay line through the sequence of delay elements $302_1$ to $302_{N-1}$. The output of each delay element 302 in the first delay line is provided to a respective weighting element 304. The number of delay elements 302 in the first delay line is N−1, and this number can be adjusted to suit particular situations and/or uses of the filter 300. For example, N may be in the range 10 to 50. In one embodiment, N takes a value of 30. The value of N can be chosen in dependence upon the application, the sampling rate, the target performance, or other factors. It will be appreciated that the number of delay elements 302 in the first delay line (i.e. the length of the delay line), and the delay introduced by each delay element determines the amount of time it takes each sample of the input signal to pass through the first delay line.

In step S404 the weighting elements $304_0$ to $304_{N-1}$ apply respective weighting coefficients ($w_0$ to $w_{N-1}$) to the tap outputs from the first delay line. The weighting coefficients are defined by a window function which is implemented by the filter. The weighting coefficients are normalised such that the maximum coefficient value is unity. A person skilled in the art would be aware of different types of window function which may be implemented in different embodiments of the filter. Different window functions may be suited for different uses of the filter, and an appropriate window function can be chosen for the filter 300 according to the use to which the filter is to be put. Some examples of possible window functions are a rectangular window function, a Hamming window function, a triangular window function and a Kaiser window function. A skilled person would be aware of the respective weighting coefficients associated with each of the window functions mentioned above, and would also be aware of other window functions which are known in the art and which may be applied to the weighting elements of the filter 300.

In step S406 the weighted outputs from the weighting elements 304 are provided to the selection block 306 which implements a max( ) operation in order to determine and select the weighted output which has the highest value. In other words, the maximum weighted output is selected by the selection block 306. That is, only the weighted output which has the highest value is selected by the selection block 306, with the other weighted outputs not being selected by the selection block 306.

As time progresses and the samples of the input signal move through the first delay line, the values of the weighted outputs supplied to the selection block 306 will change (in accordance with variations in the input signal) and as such the weighted output which is selected by the selection block 306 might not always be from the same weighting element 304. However, often the window function will be such that one of the weighting coefficients applied by a particular one of the weighting elements is larger than the other weighting coefficients applied by the other weighting elements 304, such that the weighted output selected by the selection block 306 is more likely to be the weighted output from the particular weighting element 304 than a weighted output from one of the other weighting elements. Although FIG. 3 shows the selection block 306 implementing a max( ) function, it would be apparent to a person skilled in the art that the selection block 306 could use any suitable operation in order to select the weighted output which has the highest value.

In step S408 the selected outputs are passed to the second delay line from the selection block 306. Only one weighted output (the weighted output having the highest value) is passed to the second delay line (of the supplementary filter) at a time. This means that there is no summation of simultaneously generated weighted outputs from the weighting elements 304. The selected outputs pass along the second delay line through the sequence of delay elements $308_1$ to $308_{M-1}$. The selected output is also provided directly from the selection block 306 to the summation block 310.

In step S410 the outputs from each of the taps of the second delay line are provided to the summation block 310 and are summed by the summation block 310.

In step S412 the output of the summation block 310 is provided to the dividing block 312 which divides the sum of the outputs from the taps of the second delay line by the number of taps in the second delay line (M) and provides the resulting signal on the output line of the filter 300. In this way the summation block 310 and the dividing block 312 operate to determine the average (the mean) of the outputs from the taps of the second delay line. Although the block 312 is described as a "dividing" block, in some embodiments this block could be implemented as a multiplying block which multiplies by 1/M. Multiplying by 1/M is equivalent to dividing by M.

In this sense the supplementary filter (comprising the second delay line, the summation block 310 and the dividing block 312) is an M-tap moving average filter used to smooth the signal output from the selection block 306 over time.

As described above, a window function (e.g. a Hamming or Kaiser window function) applies to the coefficients in the first tapped delay line, whereas in the second delay line there are no weighting elements shown in FIG. 3 such that the second delay line acts as an averaging stage (equivalent to weighting each tap of the second delay line with a coefficient equal to 1).

In alternative embodiments, a windowing function (e.g. a Hamming or Kaiser window function) could be used in the second delay line, similar to the window function applied by the weighting elements 304 to the taps of the first delay line.

Since only one weighted output (the weighted output having the highest value) is passed to the second delay line (of the supplementary filter), and since the weighting coefficients are normalised, the output from the filter 300 will not exceed the maximum magnitude of the input signal. This is true even when the input signal has its maximum value for multiple samples within the duration of the window of the first delay line (i.e. within the time required for a sample to pass through the first delay line). This can be advantageous and distinguishes the filter 300 over the FIR filter 100.

The method described above is repeated for each sample of the input signal received at the filter 300.

Figure 5:
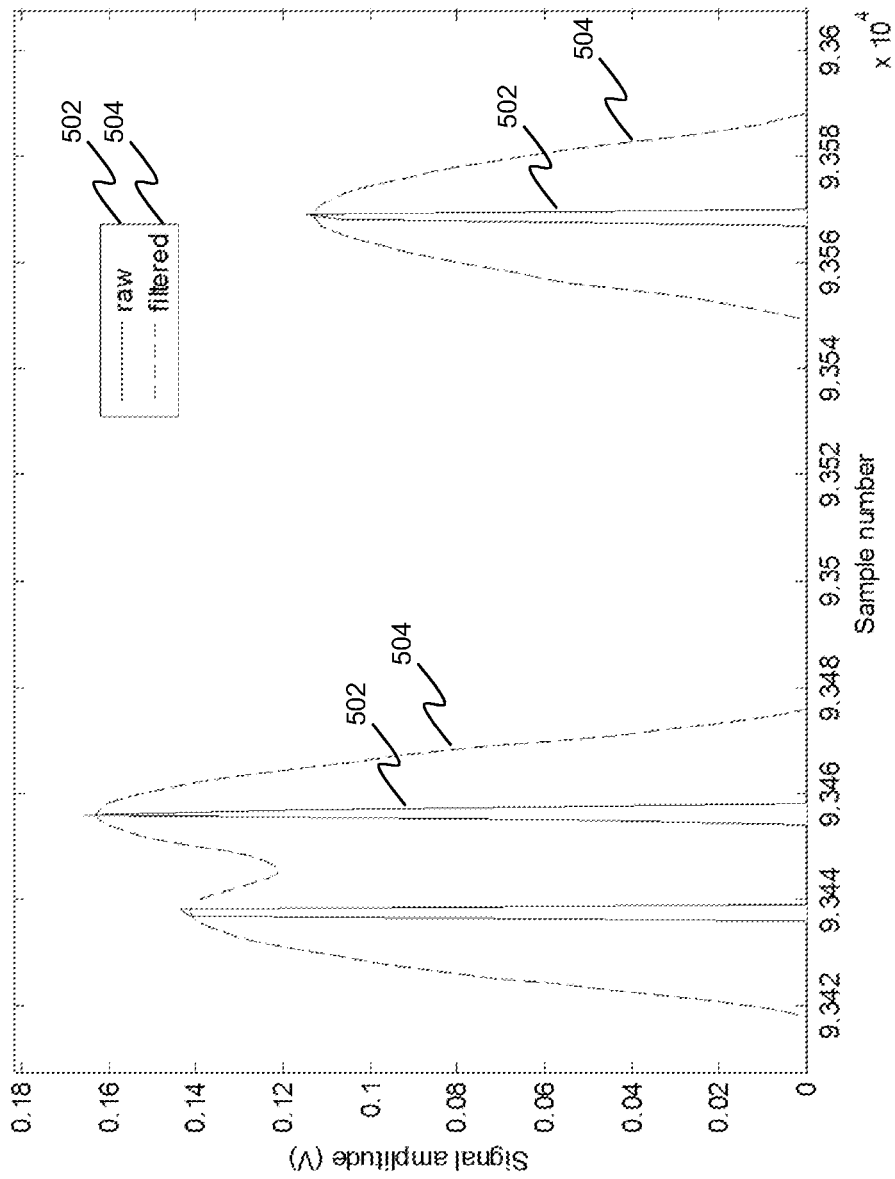
FIG. 5 shows a graph representing input and output signals from the filter of a preferred embodiment.

FIG. 5 shows a graph representing the input and output signals passing into and out of the filter 300 according to a preferred embodiment. It can be seen that the "raw" signal, i.e. the input signal 502 has three pulses of short duration. The output ("filtered") signal 504 smoothes out the pulses of the input signal over time. The peaks of the output signal for each pulse of the input signal are spread over a time equal to the duration of the window defined by the window function applied to the weighting coefficients used by the weighting elements 304. It will be appreciated that the first two peaks of the output signal corresponding to the first two pulses of the input signal shown in FIG. 5 overlap each other. This is because the time interval between the first two pulses of the input signal is less than the window duration implemented by the filter 300. However, instead of adding the two filtered signals together (e.g. at a time of $9.345 \times 10^4$ on the graph of FIG. 5) as the FIR filter 100 would (which could result in the filtered signal exceeding the maximum value of the input signal), the filter 300 selects only the maximum of the filtered signals such that the filtered signal follows whichever is the maximum of the peaks of the filtered signal.

This is particularly useful when the input signal is a scaling factor, generated from another signal and which is to be multiplied with that other signal as described in more detail below in relation to a crest factor reduction block.

Figure 1:
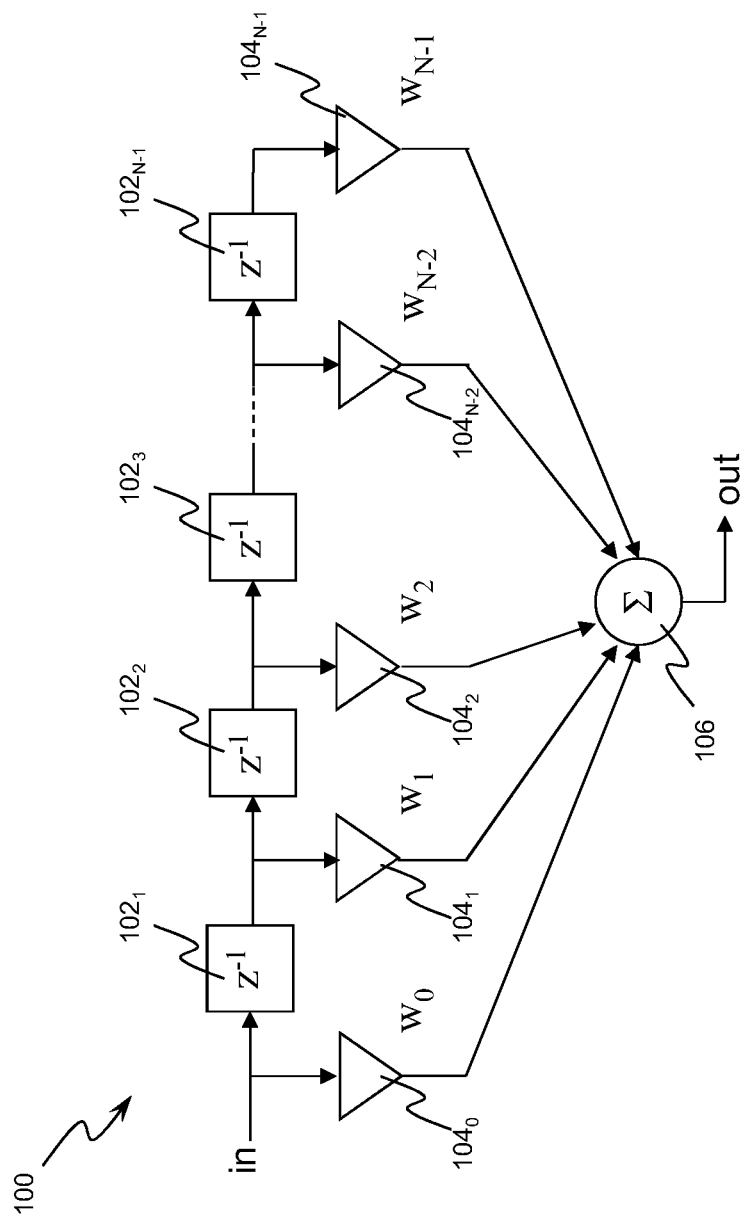
FIG. 1 is a schematic diagram of a prior art FIR filter.
Figure 2:
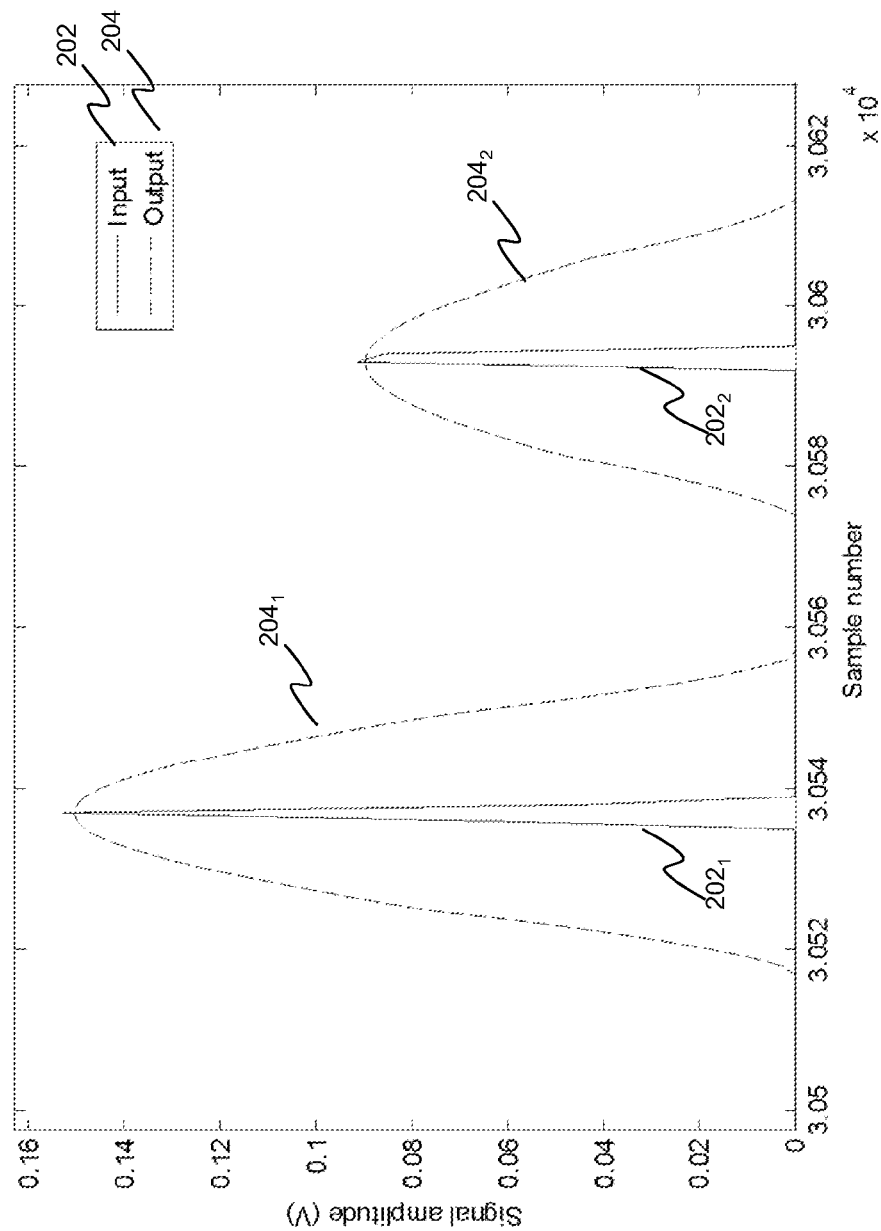
FIG. 2 shows a graph representing input and output signals from the FIR filter of FIG. 1.

FIG. 5 also shows that when a single pulse on the input signal is received within the window duration (e.g. the third pulse shown in FIG. 5) then the filtered output signal from the filter 300 has a similar form as the filtered output signal from the FIR filter 100 shown in FIG. 2.

In summary of the above, the modification to the FIR filter 100 to arrive at the filter 300 can be considered to be two-fold: firstly the FIR tap summation operation (implemented by summation block 106) is replaced with a simple max( ) function (implemented by selection block 306), which ensures the gain of the filter 300 cannot exceed unity; secondly the modified FIR filter is followed by a supplementary filter (comprising the second delay line, the summation block 310 and the dividing block 312) to smooth out the discontinuity caused by the non-linear max( ) function of the selection block 306.

There will now be described, with reference to FIGS. 6 to 11, particular embodiments in which the filter 300 is advantageously implemented in a processing block in a transmit chain of a transmitter for processing a transmit signal.

When transmitting a signal in a wireless network it can be beneficial to be able to increase the Radio Frequency (RF) transmit power. This allows the size (i.e. area) of a cell of a wireless network to be increased. One example of such a wireless network is a femtocell which provides network coverage to small areas. In particular, femtocells are small, low-power, indoor cellular base stations designed for residential deployment. They provide better network coverage and capacity than that available in such environments from an overlying macrocellular network. In addition, femtocells use a broadband connection to receive data from and send data back to the operator's network (known as "backhaul"). In other types of network, a femtocell device may be known as a home base station, an access point base station or a 3G access point. The filter of the preferred embodiments may be implemented in a transmitter transmitting wireless transmit signals within a femtocell, or within any other suitable wireless network as would be apparent to a person skilled in the art. Furthermore, the filter of the preferred embodiments may be implemented in any device which transmits wireless signals within a wireless network, such as a user terminal (or "user equipment") or a base station (or "Node B") of a wireless network.

As described above, for larger cells of a wireless network (e.g. larger femtocells) it is generally necessary to increase the Radio Frequency (RF) transmit power, relative to a smaller cell (e.g. a smaller residential femtocell), in order to serve a larger community of users. However, it is also desirable to maintain low DC power consumption of the transmitter and to keep the Bill of Material (BOM) cost of the hardware of the transmitter as low as possible. Keeping the cost of the hardware as low as possible is of particular importance in femtocells, which may serve a small number of users (e.g. residential users) who are not prepared to pay a large amount money for hardware required to access the femtocell.

One way to increase the RF Transmit (Tx) power of the transmitter is to install a larger Power Amplifier (PA) in the transmitter, but this will typically increase the BOM cost and DC power consumption of the transmitting system.

Therefore, as an alternative, a lower-cost, lower-power power amplifier can be used, but with a reduction in the transmit back-off level such that the RF power is increased. The back-off level indicates a drop in the mean power value of the input signal to the power amplifier. By reducing the back-off level the input signal to the power amplifier has a higher mean power level. If the power of the input signal to the power amplifier is below a maximum power level, then the power amplifier operates in a linear manner where an increase in input power is matched by a proportional increase in the power of the output signal from the power amplifier, (i.e. the power amplifier operates in a linear region). However, if the power of the input signal exceeds the maximum power level, then the power amplifier operates in a nonlinear manner such that an increase in the power of the input signal is not matched by a proportional increase in the power of the output signal. The power of the output signal is less than ideal in the power amplifier's nonlinear operating range resulting in increased EVM. Moreover, if the mean power value of the input signal is too high, some peaks are clipped which acts as a source of further non-linearity in the output signal from the power amplifier. It will therefore be appreciated that by reducing the transmit back-off level, the peaks of the transmitted signal will be more likely to move into the non-linear region of the power amplifier, thereby increasing the spectral leakage and degrading the Error Vector Magnitude (EVM) performance of the transmitted signal.

One solution to this problem is to introduce a Crest Factor Reduction (CFR) block into the baseband transmit chain such that the Peak-to-Average Power Ratio (PAPR) of the transmitted signal is reduced. Crest factor reduction (CFR) reduces the peak-to-average ratio of a signal by clipping the peaks of the signal. This allows additional gain to be subsequently applied to the signal without moving into the non-linear region of the power amplifier, and it allows the power amplifier to operate closer to the threshold between linear and non-linear regions (i.e. a reduced back-off level can be used) such that the power amplifier operates more efficiently.

By introducing crest factor reduction, the peak power of the input signal to the power amplifier is reduced. Therefore, the transmit back-off can also be reduced, resulting in higher RF power, without moving into the non-linear region of the power amplifier. This is because the peak to average power ratio (PAPR) of the input signal to the power amplifier is reduced. Therefore a lower-cost, lower-power PA can be used to achieve an increase in RF transmit power (which thereby allows larger cells to be implemented in the wireless network).

Figure 6:
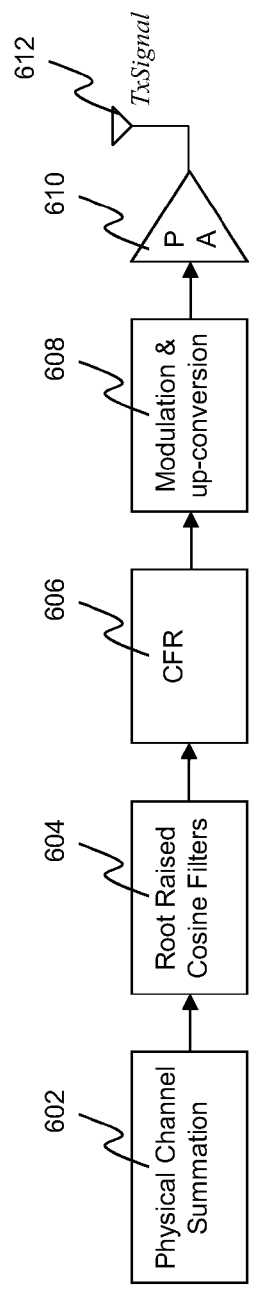
FIG. 6 is a block diagram of a transmit chain of a transmitter according to a preferred embodiment.

The location of the CFR block in the transmit chain of a WCDMA femtocell is shown in FIG. 6. The transmit chain of a transmitter shown in FIG. 6 includes a physical channel summation block 602, a root raised cosine filter block 604, a CFR block 606, a modulation and up-conversion block 608, a power amplifier 610 and an antenna 612 for wirelessly transmitting a transmit signal. An output of the physical channel summation block 602 is coupled to an input of the root raised cosine filter block 604. An output of the root raised cosine filter block 604 is coupled to an input of the CFR block 606. An output of the CFR block 606 is coupled to an input of the modulation and up-conversion block 608. An output of the modulation and up-conversion block 608 is coupled to an input of the power amplifier 610. An output of the power amplifier 610 is coupled to the antenna 612.

In operation, as is known in the art, a transmit signal is generated by the physical channel summation block 602 and passed to the root raised cosine filter block 604 for filtering and pulse-shaping (e.g. to remove high frequency components from the transmit signal while minimising the inter-symbol interference). The filtered transmit signal is then passed to the CFR block 606 where crest factor reduction is performed on the transmit signal to reduce the PAPR of the transmit signal, as is described in more detail below. The three processing blocks 602, 604 and 606 operate in the baseband section of the transmit chain of the transmitter, and operate in the digital domain. The transmit signal is then passed to the modulation and up-conversion block 608 where the transmit signal is modulated and up-converted to a suitable frequency for wireless transmission from the antenna 612. The transmit signal is then amplified by the power amplifier 610 and then transmitted from the antenna 612.

Figure 7:
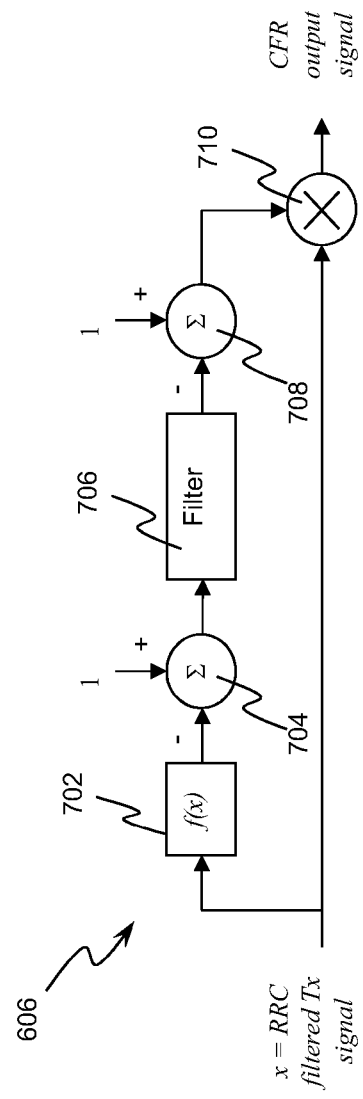
FIG. 7 is a schematic diagram of a crest factor reduction block according to a preferred embodiment.
Figure 8:
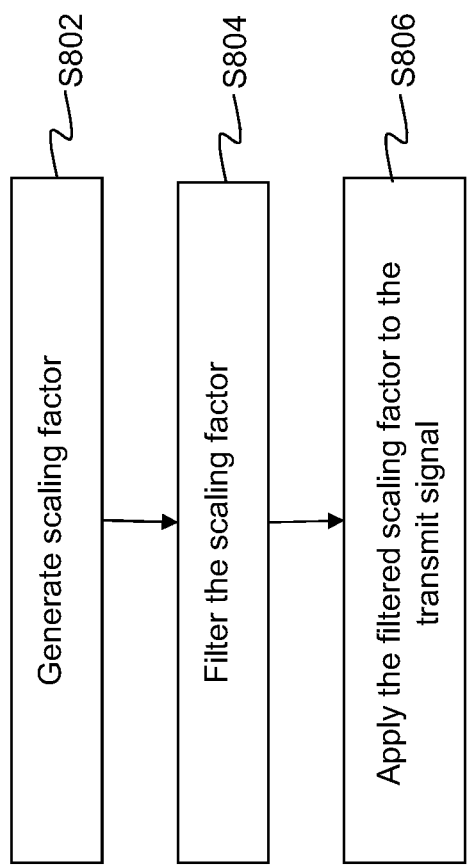
FIG. 8 is a flow chart for a process of performing crest factor reduction on a transmit signal according to a preferred embodiment.

FIG. 7 shows a schematic diagram of the crest factor reduction (CFR) block 606 according to a preferred embodiment. The CFR block 606 comprises a scaling factor generation block 702, a first summation block 704, a filter 706, a second summation block 708 and a multiplier block 710. The input transmit signal is coupled to an input of the scaling factor generation block 702 and to a first input of the multiplier block 710. An output of the scaling factor generation block 702 is coupled to a first (negative) input of the first summation block 704. A signal having a value of 1 is applied to a second (positive) input of the first summation block 704. The output of the first summation block 704 is coupled to an input of the filter 706. An output of the filter 706 is coupled to a first (negative) input of the second summation block 708. A signal having a value of 1 is applied to a second (positive) input of the second summation block 708. The output of the second summation block 708 is coupled to a second input of the multiplier block 710. The output of the multiplier block 710 provides the output transmit signal for output from the CFR block 606 to the modulation and up-conversion block 608.

The operation of the CFR block 606 is multiplicative. That is to say the CFR procedure involves the application of a time-varying scaling factor which has been calculated to reduce the peak amplitude of the transmit signal. With reference to the flow chart shown in FIG. 8, there is now described a method of performing crest factor reduction on a transmit signal using the CFR block 606 shown in FIG. 7. In step S802 a scaling factor $f(x)$ is generated from the input transmit signal in the scaling factor generation block 702. The scaling factor is generated such that if it is multiplied with the transmit signal then the output of the multiplication does not exceed a threshold value ("thresh"). The threshold value, thresh, is the maximum level to which the magnitude of the transmit signal is to be limited. Preferably, the scaling factor is generated such that if it is multiplied with the transmit signal then the output of the multiplication is equal to the input transmit signal when the input transmit signal does not exceed the threshold value, thresh.

For example, the function $f(x)$ used to generate the scaling factor may be determined using a clipping operation such that:

$$f(x) = \begin{cases} 1, & |x| < \text{thresh} \\ \frac{\text{thresh}}{|x|}, & |x| \geq \text{thresh} \end{cases}$$

Therefore, the function, $f(x)$, has a first form when the magnitude of the transmit signal is above the threshold value, and the function has a second form when the magnitude of the transmit signal is below the threshold value. Fri this way, the function $f(x)$ calculates the scaling factor required to clip the magnitude of the transmit signal to a defined threshold. The threshold is set according to the output PAPR required from the CFR block 606. The threshold value, thresh, is related to the threshold between the linear and non-linear regions of the power amplifier 610 which is subsequent to the CFR block 606 in the transmit chain.

The scaling factor $f(x)$ is input to the first summation block 704. The first summation block 704 outputs a complementary scaling factor which is given by $1-f(x)$. The complementary scaling factor is mostly zero with occasional impulses every time the input transmit signal magnitude exceeds the threshold value, thresh.

In step S804 the complementary scaling factor is filtered with the filter 706 to thereby smooth the effect of the clipping across the rise and fall of the peaks of the complementary scaling factor, rather than just truncating the magnitude of the complementary scaling factor. This filtering advantageously reduces the spectral re-growth caused by the clipping of the transmit signal. The filter 706 is implemented with the filter 300 described above and described in relation to FIGS. 3 to 5.

The filtered complementary scaling factor is then passed to the second summation block 708 and the output of the second summation block 708 is given by (1−filtered complementary scaling factor). The output of the second summation block 708 is input to the multiplier block 710 where, in step S806, it is multiplied by the input transmit signal. The output from the multiplier block 710 provides the output of the CFR block 606.

The output of the second summation block 708 mostly has a value of one. However, where the transmit signal exceeds the threshold value, thresh, then the output of the second summation block 708 has a value less than one such that when it is multiplied by the transmit signal, the result does not exceed the threshold value, thresh.

Figure 9:
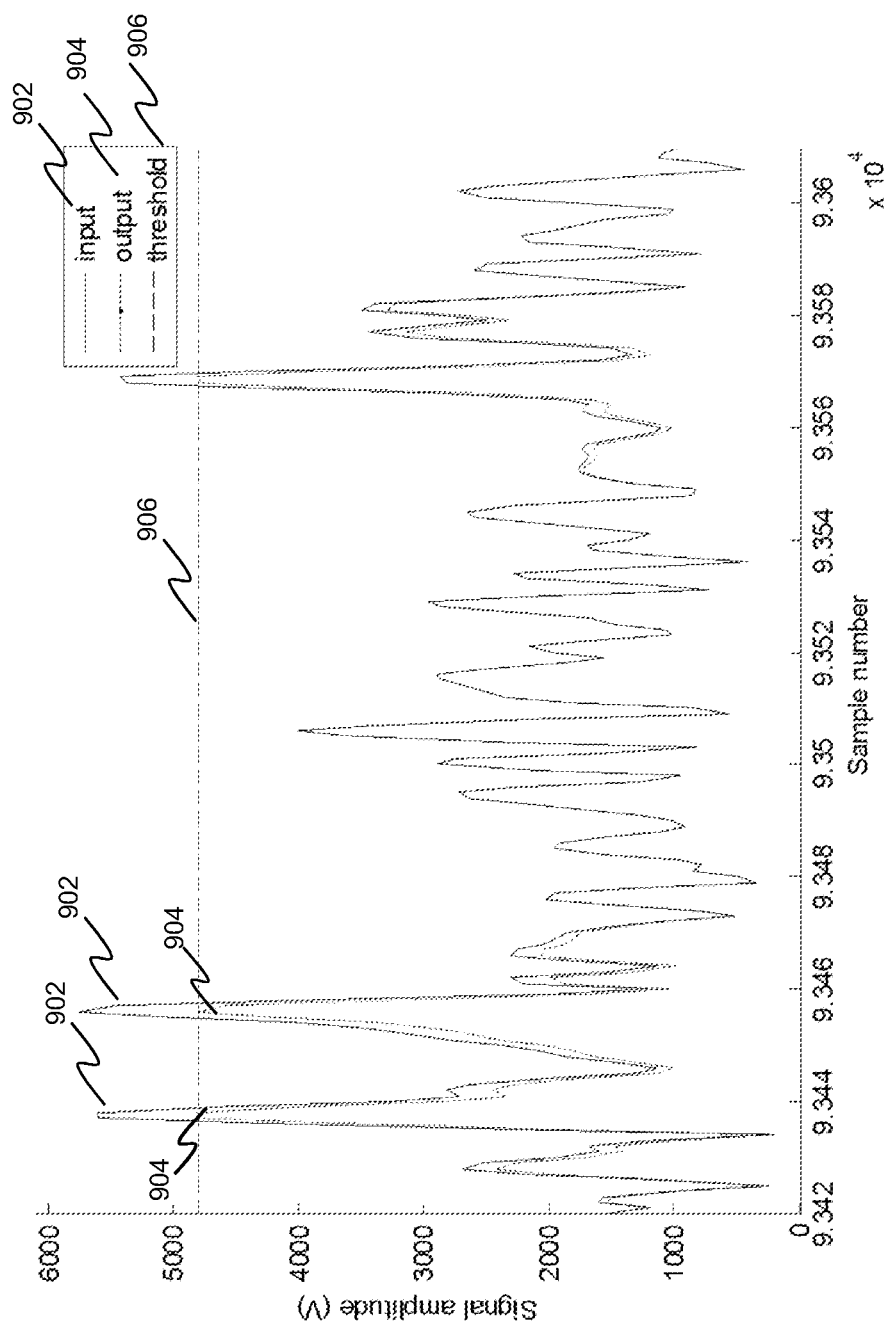
FIG. 9 shows a graph representing input and output signals from the crest factor reduction block of a preferred embodiment.

FIG. 9 shows a graph representing input and output transmit signals from the crest factor reduction block 606. The graph in FIG. 9 corresponds to the graph in FIG. 5 which shows the value of the output of the filter 706 when the filter 300 is used in the CFR block 606. By comparing FIGS. 5 and 9 it can be seen that the output of the filter 706 is non zero for times close to impulses in the input transmit signal which exceed the threshold 906. As can be seen in FIG. 9, since the output of the filter 706 is non-zero at these times, the output 904 from the CFR block 606 is lower than the input 902 to the CFR block 606 at these times. Furthermore, the peak magnitude of the output 904 from the CFR block 606 is limited such that it does not exceed the threshold value 906.

In FIG. 7, the CFR block 606 filters the complementary scaling factor (1−$f$(x)), but this is just an implementation specific detail and is equivalent to filtering the scaling factor $f$(x) itself. Therefore performing filtering on $f$(x) or on (1−$f$(x)) can both be considered to be filtering the scaling factor.

As described above, if the FIR filter 100 was used in the CFR block 606 then when multiple impulses (threshold crossings) occur within the duration of the window of the FIR filter 100, or if a single crossing lasts for longer than a single sample, the gain of the FIR filter 100 may be greater than unity and so the magnitude of the windowed output may be increased beyond the required level. This can cause excessive clipping of the transmitted signal by the multiplier block 710, which may lead to increased EVM, and a failure to reduce the magnitude of the largest peaks of the transmit signal.

However, the detrimental effect of sustained or multiple threshold crossings is overcome by using the filter 300 (described above) instead of the FIR filter 100. Since the filter 300 does not include a FIR tap summation operation (as performed by summation block 106 of FIR filter 100) and instead uses a simple max( ) function, this ensures that the gain of the filter 300 cannot exceed unity. As described above, the max( ) function of the filter 300 is followed by a supplementary filter (comprising the second delay line, the summation block 310 and the dividing block 312) to smooth out discontinuities in the scaling factor caused by the non-linear max( ) function.

A benefit of using the new filter structure 300 in the CFR block 606 is that it reduces the EVM associated with over-clipping of sustained or multiple peaks in the transmit signal (which may be introduced with the FIR filter 100), without introducing significant spectral re-growth into the transmit signal.

Figure 10:
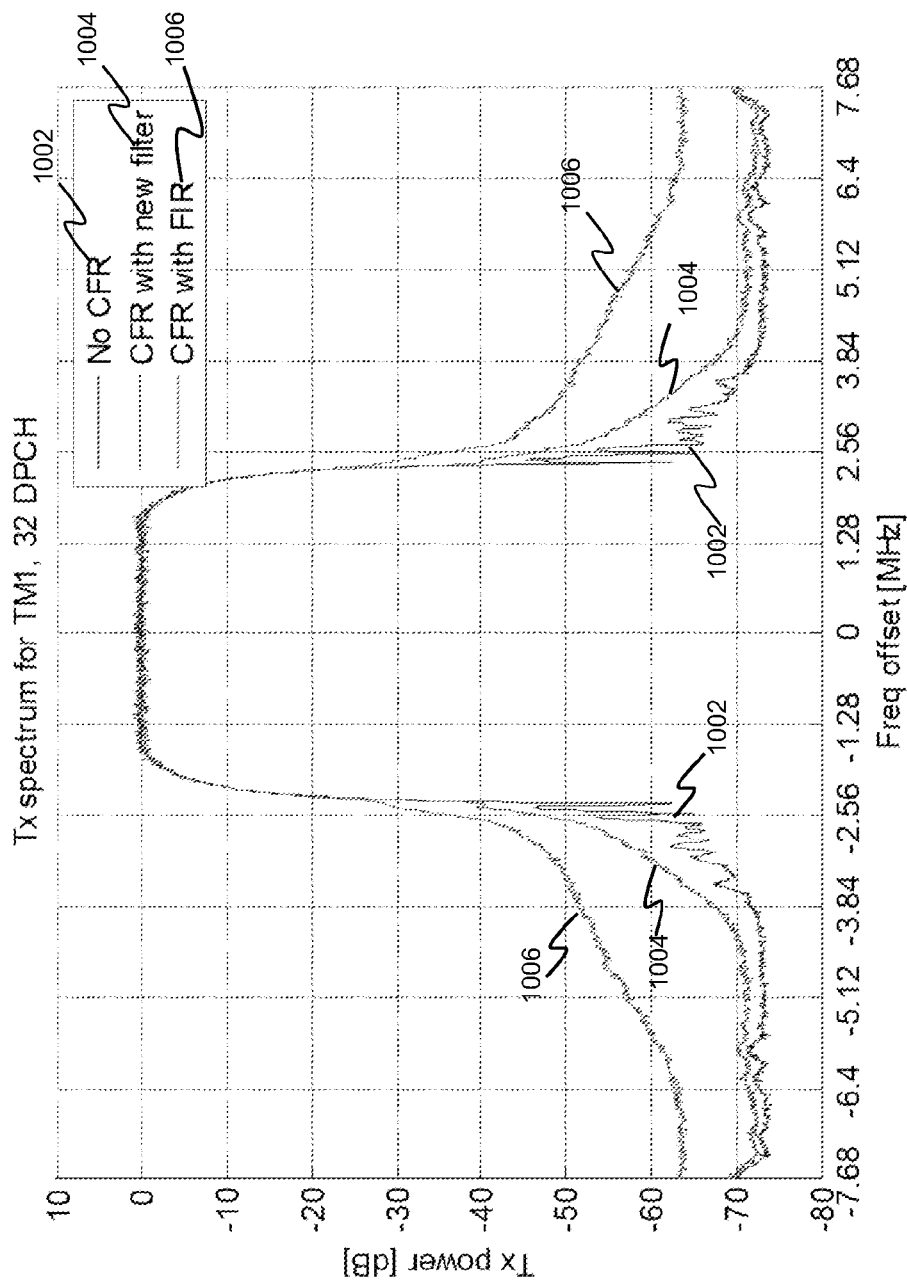
FIG. 10 shows a transmit spectrum of a WCDMA ensemble signal before and after application of crest factor reduction.
Figure 11:
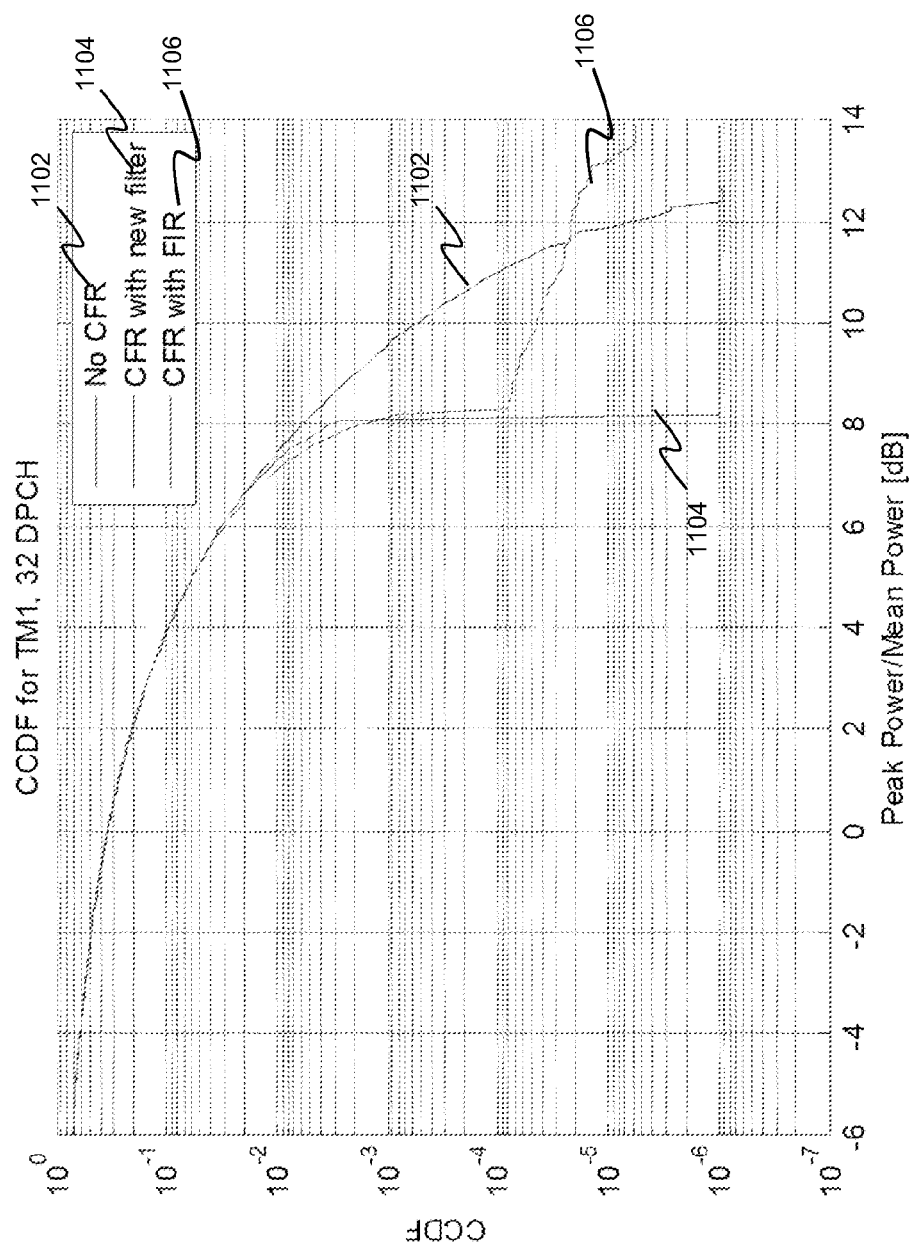
FIG. 11 is a graph showing the effectiveness of PAPR reduction by measuring the complementary cumulative distribution function (CCDF) of the transmitted signal after crest factor reduction.

Some experimental results showing the benefits of using the filter 300 in the CFR block 606 are shown in FIGS. 10 and 11. FIG. 10 shows the transmit spectrum of a typical WCDMA ensemble signal before and after application of CFR, comparing the new windowing filter 300 with the simple FIR filter 100 of equal length. In this example the CFR is set to limit the PAPR of the transmit signal to 8 dB and a 31-tap Kaiser window is used. It can be seen that implementing the CFR block 606 using the FIR filter 100 introduces more spectral re-growth into the transmit signal than implementing the CFR block 606 using the filter 300.

FIG. 11 shows the effectiveness of the PAPR reduction by measuring the complementary cumulative distribution function (CCDF) of the transmitted signal after CFR. The CCDF of the non-CFR signal clearly extends out beyond a 12 dB peak-to-average ratio while CFR with the filter 300 provides an effective reduction to about 8 dB (which was the limit to the PAPR set in the CFR block 606). The CCDF for CFR with the FIR filter 100 shows how using this filter 100 breaks down for the largest signal peaks.

It can therefore be seen from FIGS. 10 and 11 that implementing CFR with the filter 300 provides less spectral re-growth and a more effective reduction of the PAPR to the transmit signal than is provided by the FIR filter 100. FIG. 11 also shows that implementing CFR with the filter 300 provides a more effective reduction of the PAPR to the transmit signal than is provided by having no CFR at all. It can therefore be seen that use of the new filter 300 is particularly advantageous when used in the CFR block 606 of a transmitter.

While the filter 300 has been described above for use in a CFR block, the filter could be used for other purposes than for crest factor reduction, as would be apparent to a person skilled in the art.

The blocks and method steps described above in relation to FIGS. 3, 4 and 6 to 8 may be implemented in hardware or in software. Furthermore, there may be provided a computer program product comprising instructions which when executed by computer processing means at a device will implement the method described above at the device.

While this invention has been particularly shown and described with reference to preferred embodiments, it will be understood to those skilled in the art that various changes in form and detail may be made without departing from the scope of the invention as defined by the appendant claims.

What is claimed is:

1. A method of filtering a signal, comprising:
applying the signal to a delay line having a plurality of taps;
applying respective weighting coefficients of a windowing function to outputs from the plurality of taps to generate a plurality of weighted outputs;
repeatedly selecting the weighted outputs with the highest value;
filtering the selected outputs over time to generate a filtered signal, the filtering including:
passing the selected outputs to a further delay line having a further plurality of taps; and
determining an average of outputs from the further plurality of taps to generate the filtered signal; and
outputting the filtered signal.

2. The method of claim 1, wherein the signal is a scaling factor which has been generated from a transmit signal and the filtered signal is a filtered scaling factor which is to be applied to the transmit signal.

3. The method of claim 1, wherein the windowing function is a Hamming function or a Kaiser function.

4. A method of processing a transmit signal for transmission from a transmitter, the method, comprising:
generating a scaling factor from the transmit signal using a function which is dependent upon the value of the transmit signal and a threshold value, the threshold value indicating a maximum value to which the transmit signal is to be limited, wherein the function has a first form when the value of the transmit signal is above the threshold value and the function has a second form when the value of the transmit signal is below the threshold value;
filtering the scaling factor to create a filtered scaling factor by applying the scaling factor to a delay line having a plurality of taps, applying respective weighting coefficients of a windowing function to outputs from the plurality of taps to thereby generate a plurality of weighted outputs, and repeatedly selecting the weighted outputs with the highest value; and
applying the filtered scaling factor to the transmit signal such that the transmit signal does not exceed the maximum value indicated by the threshold value.

5. The method of claim 4, wherein applying the filtered scaling factor to the transmit signal reduces the peak-to-average power ratio of the transmit signal.

6. The method of claim 4, wherein applying the filtered scaling factor to the transmit signal involves a multiplication operation on the transmit signal.

7. The method of claim 4, further comprising using a power amplifier to perform power amplification on the transmit signal subsequent to applying the filtered scaling factor to the transmit signal.

8. The method of claim 7, wherein the threshold value is related to a threshold between a first regime of the power amplifier in which the power amplifier operates in a linear region and a second regime of the power amplifier in which the power amplifier operates in a non-linear region.

9. A filter for filtering a signal, comprising:
a delay line having a plurality of taps, the delay line being arranged to receive the signal;
weighting means for applying respective weighting coefficients of a windowing function to outputs from the plurality of taps to thereby generate a plurality of weighted outputs;
selecting means for repeatedly selecting for output the weighted outputs with the highest value to create selected outputs; and
filtering means for filtering the selected outputs over time to generate a filtered signal, the filtering means including:
a further delay line having a further plurality of taps, the further delay line being arranged to receive the selected outputs; and
determining means for determining an average of outputs from the further plurality of taps to generate the filtered signal.

10. The filter of claim 9, wherein the further delay line and the determining means constitute at least part of a moving average filter.

11. A processing block for processing a transmit signal for transmission from a transmitter, the processing block, comprising:
generating means for generating a scaling factor from the transmit signal using a function which is dependent upon the value of the transmit signal and a threshold value, the threshold value indicating a maximum value to which the transmit signal is to be limited;
the filter of claim 9 for filtering the scaling factor to thereby generate a filtered scaling factor; and
applying means for applying the filtered scaling factor to the transmit signal such that the transmit signal does not exceed the maximum value indicated by the threshold value.

12. The processing block of claim 11, wherein the applying means comprises multiplication means for performing a multiplication operation on the transmit signal.

* * * * *